(12) United States Patent
Matsuda et al.

(10) Patent No.: US 8,804,368 B2
(45) Date of Patent: Aug. 12, 2014

(54) DOWNWARD-FACING OPTICAL COMPONENT MODULE

(75) Inventors: Yoshinari Matsuda, Chula Vista, CA (US); Ramon Osuma, Tijuana (MX); Ivan Cazarez, Tijuana (MX); Rogelio Ruiz, Tijuana (MX)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 416 days.

(21) Appl. No.: 12/433,751

(22) Filed: Apr. 30, 2009

(65) Prior Publication Data
US 2010/0277883 A1 Nov. 4, 2010

(51) Int. Cl.
*H05K 1/11* (2006.01)
*H05K 1/14* (2006.01)

(52) U.S. Cl.
USPC ........... 361/784; 361/736; 361/790; 361/792; 361/795

(58) Field of Classification Search
USPC ......... 361/784, 736, 790, 792, 795, 728, 742, 361/760, 701
See application file for complete search history.

(56) References Cited

U.S. PATENT DOCUMENTS

| | | | |
|---|---|---|---|
| 5,608,262 A * | 3/1997 | Degani et al. | 257/723 |
| RE38,381 E | 1/2004 | Martich | |
| 6,740,973 B1 * | 5/2004 | Hsin | 257/749 |
| 7,012,282 B1 * | 3/2006 | Mostafazadeh et al. | 257/100 |
| 7,026,654 B2 * | 4/2006 | Igaki et al. | 257/80 |
| 7,122,390 B2 * | 10/2006 | Kinsman | 438/26 |
| 7,163,842 B2 | 1/2007 | Karnezos | |
| 7,894,201 B2 * | 2/2011 | Murayama et al. | 361/761 |
| 2003/0095759 A1 | 5/2003 | Dautartas et al. | |
| 2005/0166945 A1 * | 8/2005 | Whitmore | 134/18 |
| 2005/0180701 A1 * | 8/2005 | Steinberg et al. | 385/92 |
| 2008/0174972 A1 * | 7/2008 | Bygdo et al. | 361/736 |

\* cited by examiner

*Primary Examiner* — Andargie M Aychillhum
(74) *Attorney, Agent, or Firm* — John P. O'Banion

(57) ABSTRACT

A motherboard for an electronic device comprising a main printed circuit board (PCB) with a through-hole extending between the upper component surface and the lower surface. The motherboard includes a carrier PCB having a top surface and a bottom surface, and at least one component, e.g. an optical device, sensor, or the like, coupled to the top surface. The carrier PCB is mounted in an in an inverted orientation with respect to the main PCB such that the top surface of the carrier PCB faces the upper component surface of the main PCB. The carrier PCB is aligned with the main PCB such that the component is substantially aligned with the through hole of the main PCB and is visible from the lower surface of the PCB.

22 Claims, 4 Drawing Sheets

DOWNWARD-FACING OPTICAL COMPONENT MODULE

CROSS-REFERENCE TO RELATED APPLICATIONS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to a printed circuit board, and more particularly to a printed circuit board for an electronic device.

2. Description of Related Art

Many consumer audio/video or home electronics devices will include a printed circuit board (PCB) that has an optical device, e.g. LED, motion sensor, or the like. Often, these components are mounted on the user faced side on the board with connectors to connect to a control unit, which is placed inside deeper in products. In some products, shown in FIG. 1, a double-sided copper layer PCB 10 is used to mount control components 14 and other components 16 to a first side 6 of the PCB and an optical device 12 to a second side 8 of the PCB. However, these double-sided PCB's are much more costly than single-sided PCB's, and add cost to the device. In addition, this configuration creates a fairly substantial profile height $H_1$.

Accordingly, an object of the present invention is to provide a printed circuit board having a component configuration that allows the device to operate or be visible from the opposite side of a single-sided PCB. At least some of these objectives will be met in the description described below.

BRIEF SUMMARY OF THE INVENTION

An aspect of the invention is an electronic device, comprising a first printed circuit board (PCB) having top and bottom surfaces and at least one component mounted to the top surface. The device further includes a second PCB comprising a through-hole extending between the top and bottom surfaces of the of the second PCB. The first PCB is mounted in an in an inverted orientation with respect to the second PCB such that the top surface of the first PCB faces the top surface of the second PCB. The first PCB is aligned with the second PCB such that the component is substantially aligned with the through hole of the second PCB and is visible from the bottom surface of the PCB.

In one embodiment of the current aspect, the component comprises an optical device that operates in a line of sight through the second PCB toward the bottom surface. In one mode, the optical device comprises an LED that illuminates toward the bottom surface of the second PCB.

In another mode, the component comprises a sensor, wherein the sensor senses through the through-hole in the direction of the bottom surface of the second PCB. The sensor preferably has a direct line of sight through the second PCB from the bottom surface.

In some embodiments, the component extends at least partially downward into the through-hole of the second PCB.

In yet another embodiment, the top surface of the PCB further comprises a control component.

The present invention is configured such that both the first and second PCB's are a single-sided, thus saving cost.

Another aspect of the invention is a motherboard for an electronic device comprising a main PCB with a through-hole extending between the upper component surface and the lower surface. The motherboard includes a carrier PCB having a top surface and a bottom surface, and at least one component, e.g. an optical device, sensor or the like, coupled to the top surface. The carrier PCB is mounted in an in an inverted orientation with respect to the main PCB such that the top surface of the carrier PCB faces the upper component surface of the main PCB. The carrier PCB is aligned with the main PCB such that the component is substantially aligned with the through hole of the main PCB and is visible from the lower surface of the PCB.

Another aspect is an electronic device, such as a control panel, comprising a main PCB having an upper component surface and a lower surface, wherein the main PCB comprises a single-sided PCB having one or more control components mounted to the upper component surface. The control panel further includes a carrier module having a top surface and a bottom surface and at least one optical component coupled to the top surface. The main PCB further comprising a through-hole extending between the upper component surface and the lower surface, wherein the carrier module is mounted in an in an inverted orientation with respect to the main PCB such that the top surface of the carrier module faces the upper component surface of the main PCB. In addition, the carrier module is aligned with the main PCB such that the optical component is visible from the lower surface of the PCB and operates in a line of sight through the main PCB toward the lower surface.

In one embodiment, the optical device may comprise an LED that illuminates toward the bottom surface of the second PCB, a sensor that senses through the through-hole in the direction of the lower surface of the main PCB, or like device.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus generally shown in FIG. 2 through FIG. 8. It will be appreciated that the apparatus may vary as to configuration and as to details of the parts, and that the method may vary as to the specific steps and sequence, without departing from the basic concepts as disclosed herein.

Figure 2:
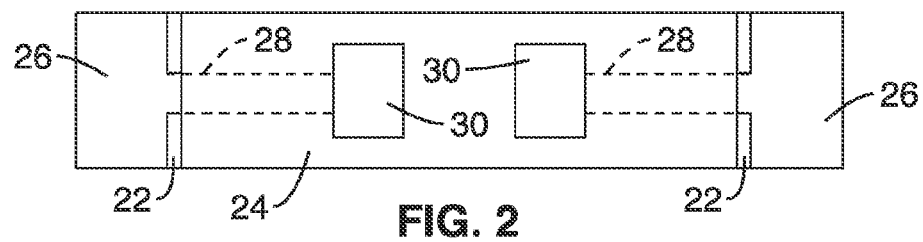
FIG. 2 is a top view of a carrier module in accordance with the present invention.
Figure 3:
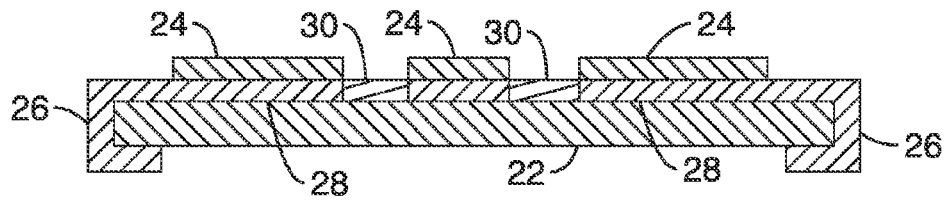
FIG. 3 is a side sectional view of the carrier module of FIG. 1.

FIGS. 2 and 3 respectively illustrate top and side sectional views of a carrier module 20 in accordance with the present invention. Carrier 20 comprises a thin resin laminate base PCB 22 which has copper plated electrodes 26 at both ends that are configured to be soldered to a main board footprint (see FIG. 6). The laminate 22 comprises a conductor track 28 coupling pads 30 to electrodes 26. The coupling pads, shaped and sized according to solder mask 24, provide a soldering junction for optical device 12 (see FIGS. 4 & 5).

The base or laminate 22 material preferably comprises glass-epoxy FR-4 (Flame Retardant 4) and CEM-3 (composite epoxy material) grade laminate. However, it is appreciated that a number of available laminates, e.g. FR-1, FR-2 (SRBP (synthetic resin bonded paper)), XPC, G-10, etc., may be used where appropriate.

Figure 4:
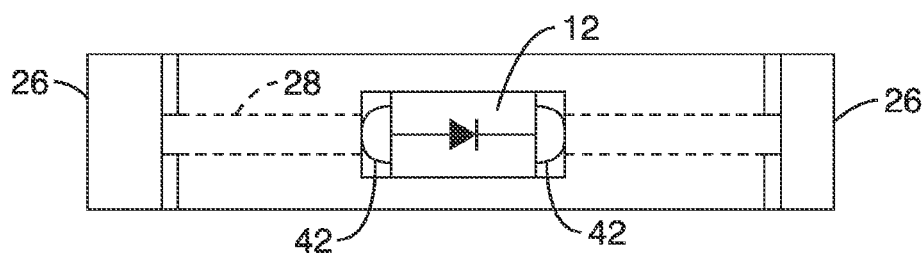
FIG. 4 is a top view of the carrier module of FIG. 1 with an installed mounted optical device in accordance with the present invention.
Figure 5:
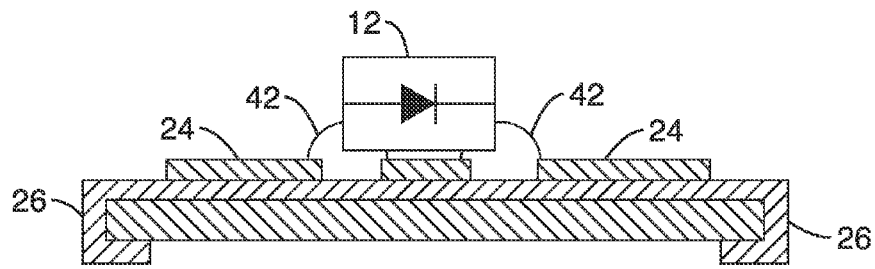
FIG. 5 is a side sectional view of the carrier module of FIG. 3.

FIGS. 4 and 5 respectively illustrate top and side sectional views of carrier module 20 assembled with a surface mount device (SMD) type of optical device 12, such as a light emitting diode (LED) and/or motion sensor, on the substrate carrier. The optical device is mounted to pads 30 via solder balls 42. Once the optical device 12 and carrier are assembled, the module 20 may be packed as taping or tray packing.

Figure 6:
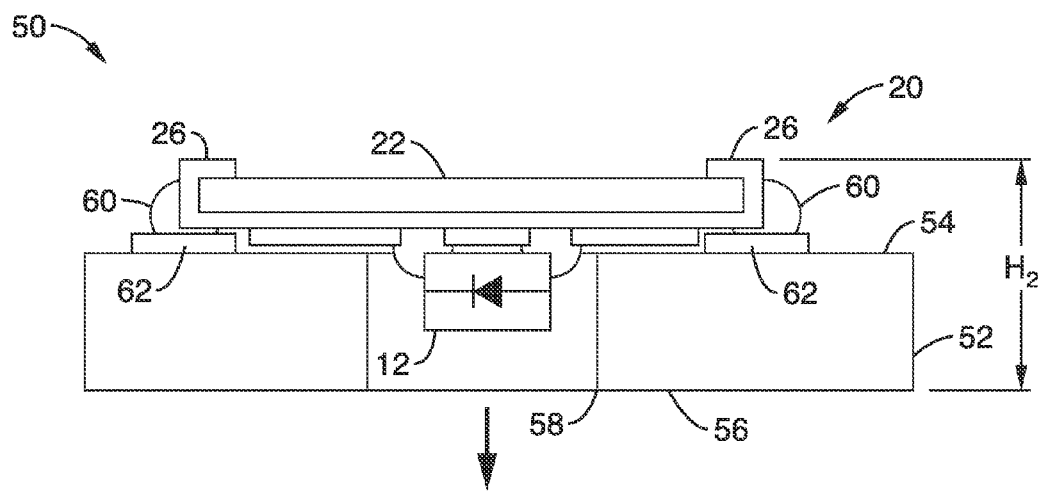
FIG. 6 is a side sectional view of a motherboard assembly mounted with an inverted carrier module in accordance with the present invention.
Figure 7:
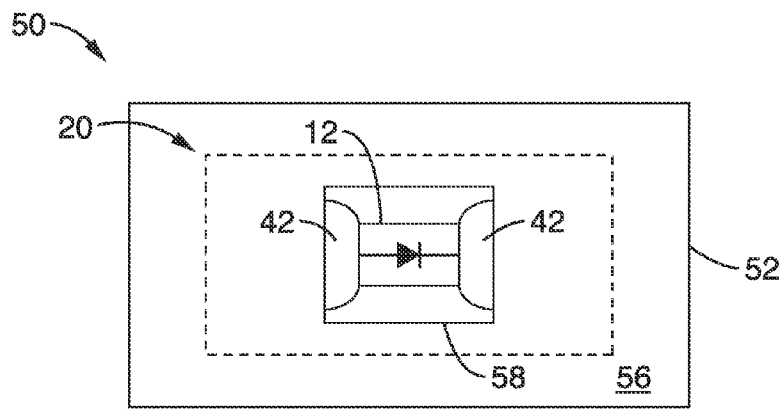
FIG. 7 is a bottom view of the motherboard assembly of FIG. 6.

FIGS. 6 and 7 respectively illustrate side sectional and bottom views of assembly 50 having the carrier module 20 reversely mounted and soldered on main single-sided copper layer board 52. The board 52 comprises a centrally located hole 58 wherein the optical device is positioned at least partially into or at least aligned with. The thru-hole 58 is shaped and sized to fit the optical component 12 shape when the carrier module 20 is disposed upside down on first face 54 of the main PCB 52.

In a second mount process, the packed module 20 is picked and placed (e.g. by industrial SMD placer) on the single-sided layer mother board 52 into hole 58. Component surface 54 of the PCB 52 comprises a footprint 62 for coupling to electrodes 25 of the board with solder joints 60.

For purposes of this description, a single-sided PCB is a PCB having conductor tracks on one side (e.g. top surface) of the PCB. In a double-sided PCB, connector tracks are present on both sides (top and bottom) of the PCB.

The optical component 12 faces downward on the board through the hole 58. As shown in the bottom view of FIG. 7, has a direct line of sight through the board 52 as viewed from the bottom surface 56 of the main PCB 52. The optical function of device 12 is performed through hole or aperture 58.

Figure 1:
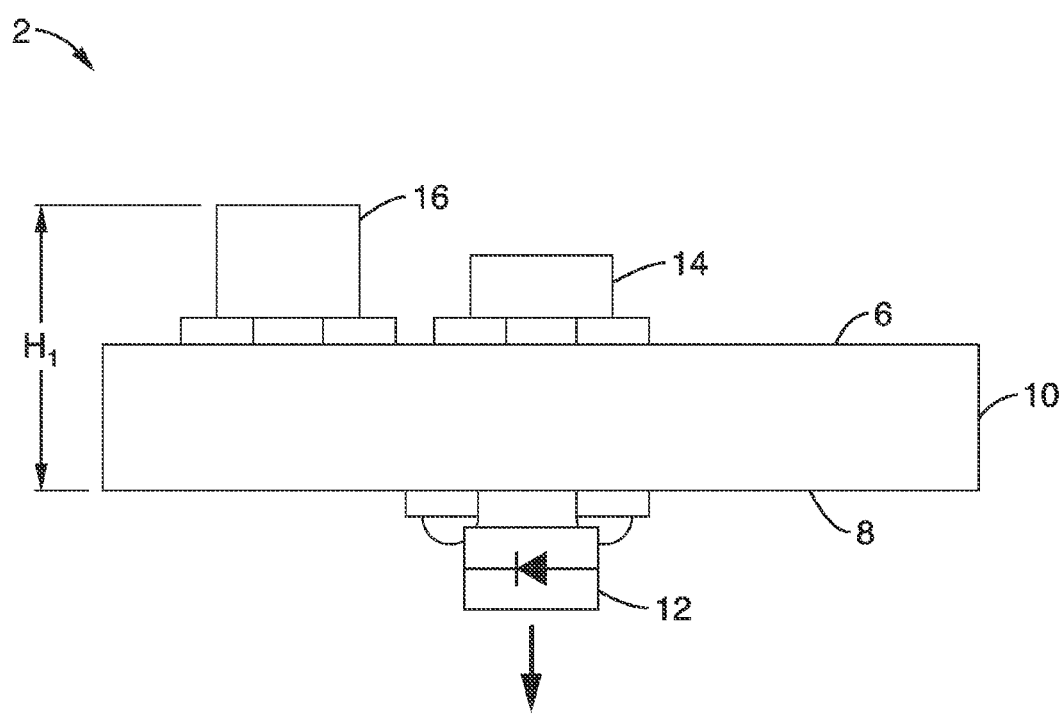
FIG. 1 is a side view of a prior art device having an optical device mounted to one side of a double sided printed circuit board.

As shown in FIG. 6, the total height $H_2$ of assembly 50 is significantly decreased when viewed in comparison to $H_1$ prior art device 2 shown in FIG. 1. Thus, the assembly 50 of the present invention not only results in a much more inexpensive fabrication, but also is beneficial in decreasing the thickness and/or size of the overall device.

Figure 8:
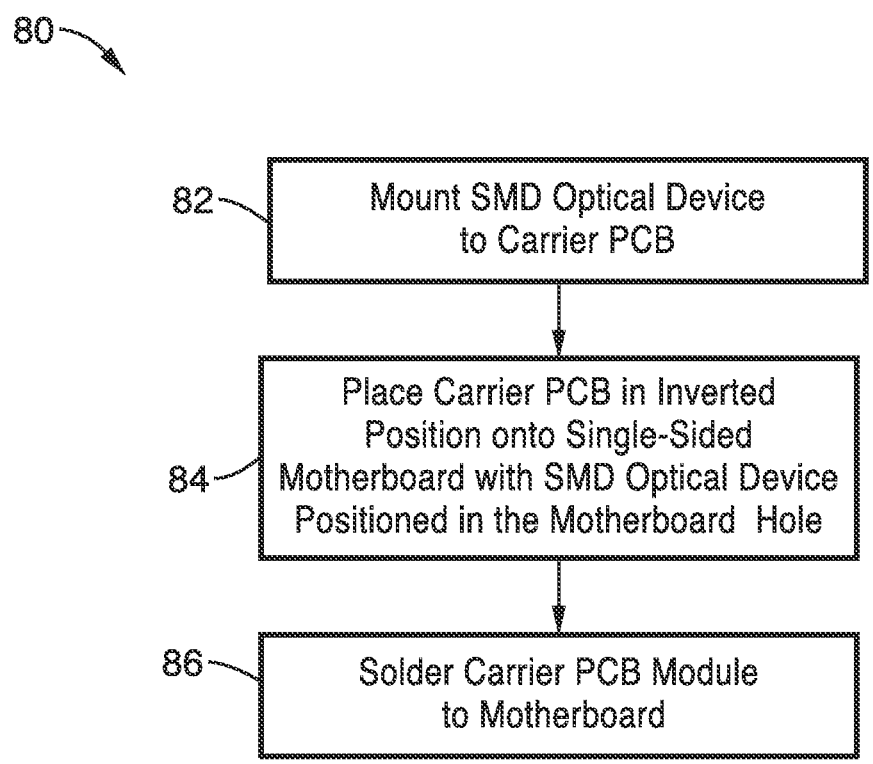
FIG. 8 illustrates a flow diagram of a method of fabricating a downward facing optical component in accordance with the present invention.

FIG. 8 illustrates a flow diagram of a method 80 of fabricating a downward facing optical component in accordance with the present invention. The first step comprises mounting the SMD optical device 12 to the carrier PCB 20 at step 82, e.g. by soldering the electrodes 26 the optical device 12 to the pads 30 of the carrier 20.

In step 84, the carrier PCB 20 is then placed in an inverted orientation onto a single-sided motherboard such that the top surface of the module or carrier PCB 20 is facing the top surface 64 of the main or motherboard PCB 52. The two PCB's are aligned so that the optical device 12 is positioned at least partially within thru-hole 58 in the motherboard 52.

In step 86, the carrier PCB 20 is then soldered to the motherboard to complete the assembly.

It is appreciated that, in addition to the specific embodiments detailed above, the beneficial aspects of the present invention may be used in a variety of different applications. Particularly, the inverted component module 20 may not be limited to an optical device, and is particularly useful in any electrical product where there is a user control panel or sensor, or where function is desired from an opposite side of the PCB without having to revert to a double-sided PCB. The detailed embodiments disclosed above are particularly useful of user control panels for CDVA (Cost Down/Value Analysis) activities and for motion sensor boards.

As can be seen, therefore, the present invention includes the following inventive embodiments among others:

1. An electronic device, comprising:
a first printed circuit board (PCB) having top and bottom surfaces and at least one component mounted to the top surface;
a second PCB comprising top surface and a bottom surface;
the second PCB further comprising a through-hole extending between the top and bottom surfaces of the of the PCB;
wherein the first PCB is mounted in an in an inverted orientation with respect to the second PCB such that the top surface of the first PCB faces the top surface of the second PCB; and wherein the first PCB is aligned with the second PCB such that the component is substantially aligned with the through hole of the second PCB and is visible from the bottom surface of the PCB.

2. An electronic device as recited in embodiment 1, wherein the component comprises an optical device that operates in a line of sight through the second PCB toward the bottom surface.

3. An electronic device as recited in embodiment 2, wherein the optical device comprises an LED that illuminates toward the bottom surface of the second PCB.

4. An electronic device as recited in embodiment 1, wherein the component comprises a sensor, and wherein the sensor senses through the through-hole in the direction of the bottom surface of the second PCB.

5. An electronic device as recited in embodiment 4, wherein the sensor has a direct line of sight through the second PCB from the bottom surface.

6. An electronic device as recited in embodiment 1, wherein the component extends at least partially downward into the through-hole of the second PCB.

7. An electronic device as recited in embodiment 1, wherein the top surface of the PCB further comprises a control component.

8. An electronic device as recited in embodiment 1, wherein the first and second PCB's are a single-sided.

9. A motherboard, comprising:
a main PCB having an upper component surface and a lower surface;
a carrier PCB having a top surface and a bottom surface;
the carrier PCB comprising at least one component coupled to the top surface;
the main PCB further comprising a through-hole extending between the upper component surface and the lower surface;
wherein the carrier PCB is mounted in an in an inverted orientation with respect to the main PCB such that the top surface of the carrier PCB faces the upper component surface of the main PCB; and
wherein the carrier PCB is aligned with the main PCB such that the component is substantially aligned with the through hole of the main PCB and is visible from the lower surface of the PCB.

10. A motherboard as recited in embodiment 9, wherein the component comprises an optical device that operates in a line of sight through the main PCB toward the lower surface.

11. A motherboard as recited in embodiment 10, wherein the optical device comprises an LED that illuminates toward the lower surface of the main PCB.

12. A motherboard as recited in embodiment 10, wherein the component comprises a sensor, and wherein the sensor senses through the through-hole in the direction of the lower surface of the main PCB.

13. A motherboard as recited in embodiment 12, wherein the sensor has a direct line of sight through the main PCB from the lower surface.

14. A motherboard as recited in embodiment 10, wherein the component extends at least partially downward into the through-hole of the main PCB.

15. A motherboard as recited in embodiment 10, wherein the upper component surface of the main PCB further comprises a control component.

16. A motherboard as recited in embodiment 9, wherein the main PCB is single-sided.

17. An electronic device, comprising:
a main PCB having an upper component surface and a lower surface;
wherein the main PCB comprises a single-sided PCB having one or more control components mounted to the upper component surface;
a carrier module having a top surface and a bottom surface;
the carrier module comprising at least one optical component coupled to the top surface;
the main PCB further comprising a through-hole extending between the upper component surface and the lower surface;
wherein the carrier module is mounted in an in an inverted orientation with respect to the main PCB such that the top surface of the carrier module faces the upper component surface of the main PCB; and
wherein the carrier module is aligned with the main PCB such that the optical component is visible from the lower surface of the PCB and operates in a line of sight through the main PCB toward the lower surface.

18. An electronic device as recited in embodiment 17, wherein the optical device comprises an LED that illuminates toward the bottom surface of the main PCB.

19. An electronic device as recited in embodiment 17:
wherein the optical component comprises a sensor; and
wherein the sensor senses through the through-hole in the direction of the lower surface of the main PCB.

20. An electronic device as recited in embodiment 17, wherein the optical component extends at least partially downward into the through-hole of the main PCB.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:
1. An electronic device, comprising:
a first printed circuit board (PCB);
a second PCB configured to be coupled to the first PCB;
the first PCB having top and bottom surfaces and at least one component mounted to the top surface of the first PCB prior to the first PCB being coupled to the second PCB;
the second PCB comprising a top surface and a bottom surface;
the second PCB further comprising a through-hole extending between the top and bottom surfaces of the second PCB;

wherein the first PCB is mounted in an inverted orientation with respect to the second PCB such that the top surface of the first PCB faces the top surface of the second PCB; and wherein the first PCB is aligned with the second PCB such that the component is substantially aligned with the through hole of the second PCB and is visible from the bottom surface of the second PCB;

wherein the component comprises an optical device that operates in a line of sight through the second PCB toward the bottom surface of the second PCB.

2. An electronic device as recited in claim 1, wherein the optical device comprises an LED that illuminates toward the bottom surface of the second PCB.

3. An electronic device as recited in claim 1, wherein the component comprises a sensor, and wherein the sensor senses through the through-hole in the direction of the bottom surface of the second PCB.

4. An electronic device as recited in claim 3, wherein the sensor has a direct line of sight through the second PCB from the bottom surface.

5. An electronic device as recited in claim 1, wherein the component extends at least partially downward into the through-hole of the second PCB.

6. An electronic device as recited in claim 1, wherein the top surface of the PCB further comprises a control component.

7. An electronic device as recited in claim 1, wherein the first and second PCB's are a single-sided.

8. A motherboard, comprising:
a main PCB having an upper component surface and a lower surface;
a carrier PCB having a top surface and a bottom surface;
the carrier PCB comprising at least one component coupled to the top surface of the carrier PCB;
the main PCB further comprising a through-hole extending between the upper component surface and the lower surface of the main PCB;
wherein the carrier PCB is mounted in an inverted orientation with respect to the main PCB such that the top surface of the carrier PCB faces the upper component surface of the main PCB;
wherein the carrier PCB is aligned with the main PCB such that the component is substantially aligned with the through hole of the main PCB and is visible from the lower surface of the main PCB; and
wherein the component comprises a sensor, and wherein the sensor senses through the through-hole in the direction of the lower surface of the main PCB.

9. A motherboard as recited in claim 8, wherein the component comprises an optical device that operates in a line of sight through the main PCB toward the lower surface.

10. A motherboard as recited in claim 9, wherein the optical device comprises an LED that illuminates toward the lower surface of the main PCB.

11. A motherboard as recited in claim 9, wherein the component extends at least partially downward into the through-hole of the main PCB.

12. A motherboard as recited in claim 9, wherein the upper component surface of the main PCB further comprises a control component.

13. A motherboard as recited in claim 8, wherein the sensor has a direct line of sight through the main PCB from the lower surface.

14. A motherboard as recited in claim 8, wherein the main PCB is single-sided.

15. A motherboard as recited in claim 8, wherein the at least one component is coupled to the top surface of the carrier PCB prior to the carrier PCB being mounted to the main PCB.

16. An electronic device, comprising:
a main PCB having an upper component surface and a lower surface;
wherein the main PCB comprises a single-sided PCB having one or more control components mounted to the upper component surface;
a carrier module having a top surface and a bottom surface;
the carrier module comprising at least one optical component coupled to the top surface of the carrier module;
the main PCB further comprising a through-hole extending between the upper component surface and the lower surface of the main PCB;
wherein the carrier module is mounted in an inverted orientation with respect to the main PCB such that the top surface of the carrier module faces the upper component surface of the main PCB; and
wherein the carrier module is aligned with the main PCB such that the optical component is visible from the lower surface of the main PCB and operates in a line of sight through the main PCB toward the lower surface of the main PCB.

17. An electronic device as recited in claim 16, wherein the optical device comprises an LED that illuminates toward the lower surface of the main PCB.

18. An electronic device as recited in claim 16:
wherein the optical component comprises a sensor; and
wherein the sensor senses through the through-hole in the direction of the lower surface of the main PCB.

19. An electronic device as recited in claim 16, wherein the optical component extends at least partially downward into the through-hole of the main PCB.

20. An electronic device as recited in claim 16, wherein the at least one optical component is coupled to the top surface of the carrier module prior to the carrier module being mounted to the main PCB.

21. An electronic device, comprising:
a first single-sided printed circuit board (PCB);
a second single-sided PCB configured to be coupled to the first PCB;
the first PCB having a top component surface and bottom surface and at least one component mounted to the top component surface prior to the first PCB being coupled to the second PCB;
the second PCB comprising a top component surface and a bottom surface;
the second PCB further comprising a through-hole extending between the top component surface and bottom surface of the second PCB;
wherein the first PCB is mounted in an inverted orientation with respect to the second PCB such that the top component surface of the first PCB faces the top component surface of the second PCB;
wherein the first PCB is aligned with the second PCB such that the component is substantially aligned with the through hole of the second PCB and is visible from the bottom surface of the second PCB; and
wherein the component comprises an optical device that operates in a line of sight through the second PCB toward the bottom surface of the second PCB.

22. An electronic device as recited in claim 21, wherein the component extends at least partially downward into the through-hole of the second PCB.

* * * * *